(12) United States Patent
Den Boef

(10) Patent No.: US 8,248,608 B2
(45) Date of Patent: Aug. 21, 2012

(54) IMPRINT LITHOGRAPHY

(75) Inventor: Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 397 days.

(21) Appl. No.: 12/698,418

(22) Filed: Feb. 2, 2010

(65) Prior Publication Data

US 2010/0195102 A1    Aug. 5, 2010

Related U.S. Application Data

(60) Provisional application No. 61/149,853, filed on Feb. 4, 2009.

(51) Int. Cl.
G01B 11/00    (2006.01)
(52) U.S. Cl. ........................ 356/401; 356/400
(58) Field of Classification Search ........... 356/399–401
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,180,239 B1 | 1/2001 | Whitesides et al. | |
| 6,334,960 B1 | 1/2002 | Willson et al. | |
| 7,070,405 B2 | 7/2006 | Sreenivasan et al. | |
| 7,618,250 B2 * | 11/2009 | Van Santen et al. | 425/171 |
| 7,727,453 B2 | 6/2010 | Sreenivasan et al. | |
| 7,884,935 B2 * | 2/2011 | Suehira et al. | 356/401 |
| 2004/0124566 A1 | 7/2004 | Sreenivasan et al. | |
| 2005/0067379 A1 * | 3/2005 | Sreenivasan et al. | 216/44 |
| 2005/0274693 A1 | 12/2005 | Heidari et al. | |
| 2006/0032437 A1 * | 2/2006 | McMackin et al. | 118/100 |
| 2006/0267231 A1 | 11/2006 | Van Santen et al. | |
| 2006/0275524 A1 | 12/2006 | Van Santen et al. | |
| 2009/0108483 A1 * | 4/2009 | Suehira et al. | 264/40.5 |
| 2010/0065987 A1 * | 3/2010 | Den Boef et al. | 264/408 |
| 2010/0084565 A1 * | 4/2010 | Van Santen et al. | 250/370.1 |

FOREIGN PATENT DOCUMENTS

| | | |
|---|---|---|
| JP | 60-077423 | 5/1985 |
| JP | 62-190725 | 8/1987 |
| JP | 10-335241 | 12/1998 |

(Continued)

OTHER PUBLICATIONS

Japanese Office Action mailed Jan. 26, 2012 in corresponding Japanese Patent Application No. 2010-016184.

(Continued)

*Primary Examiner* — Layla Lauchman
(74) *Attorney, Agent, or Firm* — Pillsbury Winthrop Shaw Pittman LLP

(57) ABSTRACT

A method of determining the location of a lithographic substrate relative to an imprint template is disclosed. The method includes positioning the substrate adjacent to the imprint template such that an alignment grating on the substrate and an alignment grating on the imprint template form a composite diffraction grating, directing alignment radiation beam comprising radiation at a first wavelength and radiation at a second wavelength, the second wavelength being longer than the first wavelength, at the composite diffraction grating, detecting radiation diffracted from the composite grating during relative lateral movement between the imprint template and the substrate, using the detected radiation at the second wavelength to obtain information regarding a separation between the substrate alignment grating and the imprint template alignment grating, and using the detected radiation at the first wavelength to obtain information regarding the lateral position of the substrate alignment grating relative to the imprint template alignment grating.

21 Claims, 6 Drawing Sheets

FOREIGN PATENT DOCUMENTS

| | | |
|---|---|---|
| JP | 2000-031031 | 1/2000 |
| JP | 2005-533393 | 11/2005 |
| JP | 2006-013400 | 1/2006 |
| JP | 2006-516065 | 6/2006 |
| JP | 2006-332677 | 12/2006 |
| JP | 2007-139752 | 6/2007 |
| JP | 2007-173614 | 7/2007 |
| JP | 2007-200953 | 8/2007 |
| JP | 2008-008889 | 1/2008 |
| JP | 2008-100507 | 5/2008 |
| WO | 02/067055 A2 | 8/2002 |

OTHER PUBLICATIONS

J. Haisma et al., "Mold-assisted nanolithography: A process for reliable pattern replication," J. Vac. Sol. Technol. B 14 (6), Nov./Dec. 1996, pp. 4124-4128.

* cited by examiner

IMPRINT LITHOGRAPHY

This application claims priority and benefit under 35 U.S.C. §119(e) to U.S. Provisional Patent Application No. 61/149,853, entitled "Imprint Lithography", filed on Feb. 4, 2009. The content of that application is incorporated herein in its entirety by reference.

FIELD

The present invention relates to imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (BUY) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the wavelength of a radiation source or the numerical aperture of a projection system. Instead, the resolution is mainly limited to the pattern density on the imprint template.

Lithography typically involves applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause the device to be non-functional. A lithographic apparatus therefore may include an alignment apparatus which is intended to align each pattern with a previously provided pattern.

It is desirable to provide an imprint lithography alignment apparatus and method which is novel and inventive over the prior art.

SUMMARY

According to an aspect, there is provided a method of determining the location of a lithographic substrate relative to an imprint template, the method comprising: positioning the substrate adjacent to the imprint template such that an alignment grating on the substrate and an alignment grating on the imprint template form a composite diffraction grating; providing an alignment radiation beam comprising radiation at a first wavelength and radiation at a second wavelength, the second wavelength being longer than the first wavelength; directing the alignment radiation beam at the composite diffraction grating; providing relative lateral movement between the imprint template and the substrate; detecting radiation diffracted from the composite grating during the relative lateral movement; using the detected radiation at the second wavelength to obtain information regarding a separation between the substrate alignment grating and the imprint template alignment grating; and using the detected radiation at the first wavelength to obtain information regarding the lateral position of the substrate alignment grating relative to the imprint template alignment grating.

The first wavelength may be sufficiently short, relative to the pitch of the imprint template alignment grating and the substrate alignment grating, that significant amounts of radiation in the $1^{st}$ diffraction order propagate between the alignment gratings.

The second wavelength may be sufficiently long, relative to the pitch of the imprint template alignment grating and the substrate alignment grating, that significant amounts of radiation in the $1^{st}$ diffraction order do not propagate between the alignment gratings.

The alignment radiation beam may have a coherence length which is longer than difference between the optical path traveled by radiation returned from the imprint template alignment grating and the optical path traveled by radiation returned from the substrate alignment grating.

The information regarding the separation between the substrate alignment grating and the imprint template alignment grating may be used to maintain a substantially constant separation between the substrate alignment grating and the imprint template alignment grating during the relative lateral movement between the imprint template and the substrate.

According to an aspect, there is provided a lithographic apparatus comprising: an imprint template holder configured to hold an imprint template; a substrate table configured to hold a substrate to be imprinted by the imprint template; an alignment radiation beam source configured to provide an alignment radiation beam comprising radiation which includes a first wavelength and a second wavelength; a detector arranged to detect the intensity of alignment radiation diffracted from an alignment grating provided on the imprint template and an alignment grating provided on the substrate, the detector configured to distinguish between the first wavelength and the second wavelength; and a controller configured to receive a signal relating to the detected intensity of the diffracted second wavelength, and to use the signal to maintain a constant or substantially constant separation between the imprint template alignment grating and the substrate alignment grating during lateral movement of the imprint template relative to the substrate.

According to an aspect, there is provided a lithographic apparatus comprising: an imprint template holder configured to hold an imprint template; a substrate table configured to hold a substrate to be imprinted by the imprint template; an alignment radiation beam source configured to provide an alignment radiation beam comprising radiation which includes a first wavelength and a second wavelength; a detector arranged to detect the intensity of alignment radiation diffracted from an alignment grating on the imprint template and an alignment grating on the substrate, the detector configured to distinguish between the first wavelength and the second wavelength; and a processor configured to receive signals output by the detector, and to determine the lateral location of the substrate alignment grating relative to the imprint template alignment grating, the processor being configured to take into account variation of the separation between the substrate and the imprint template during relative lateral movement between the imprint template and the substrate.

BRIEF DESCRIPTION OF THE DRAWINGS

Specific embodiments of the invention will be described with reference to the accompanying Figures, in which.

DETAILED DESCRIPTION

Figure 1A:
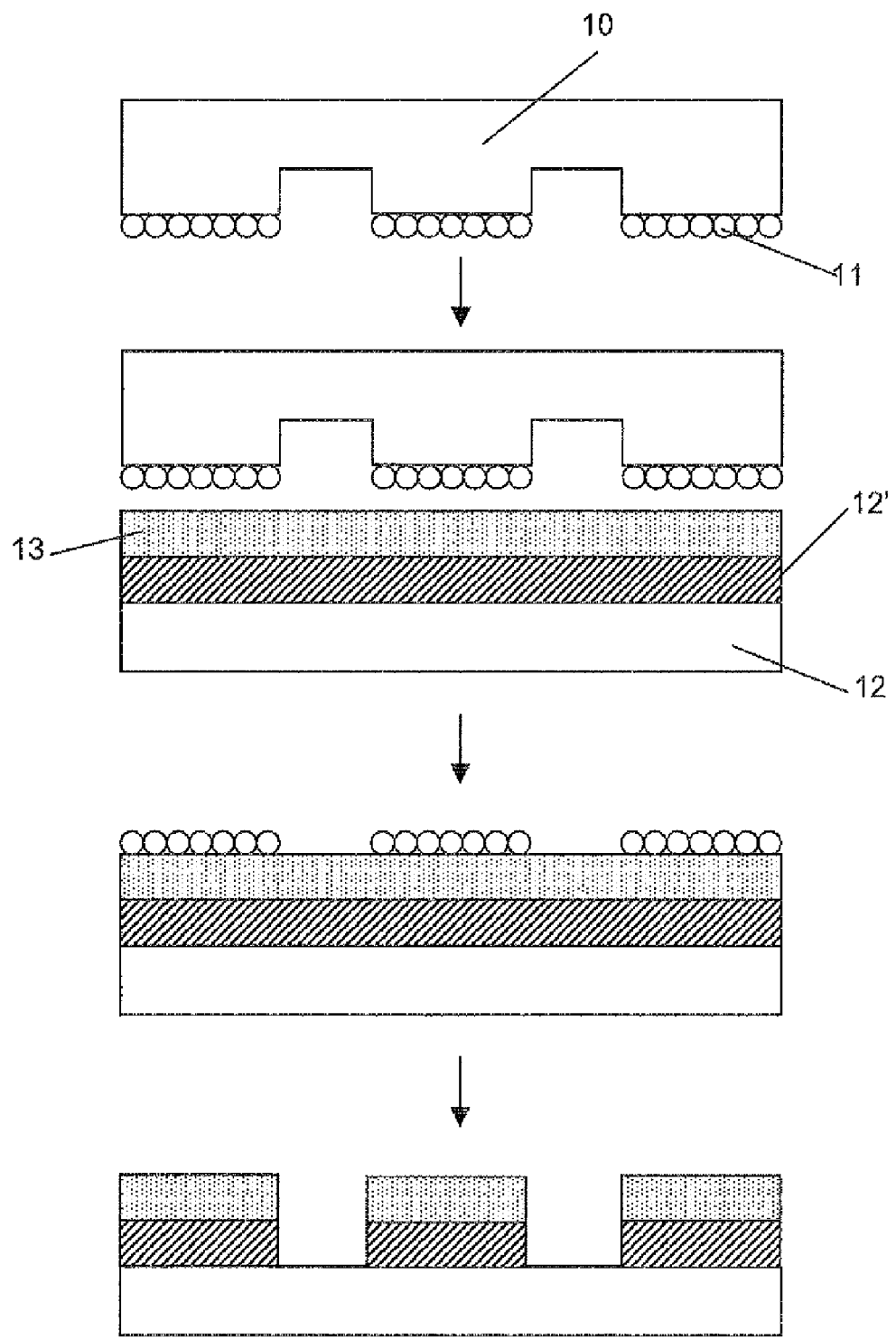
FIGS. 1*a-c* schematically shows examples of, respectively, micro-contact printing, hot imprint, and ultraviolet (UV) imprint.
Figure 1B:
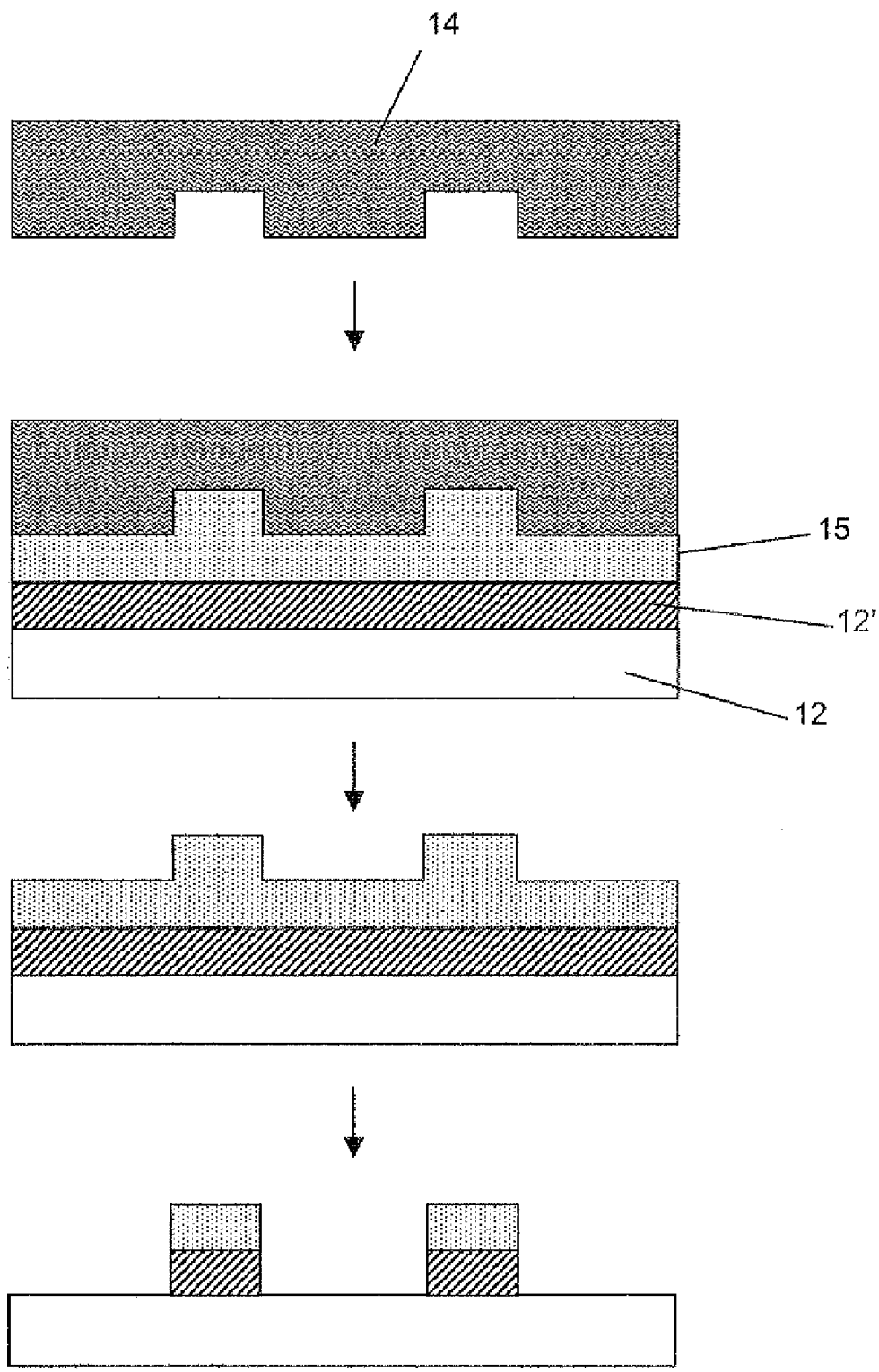
Figure 1C:
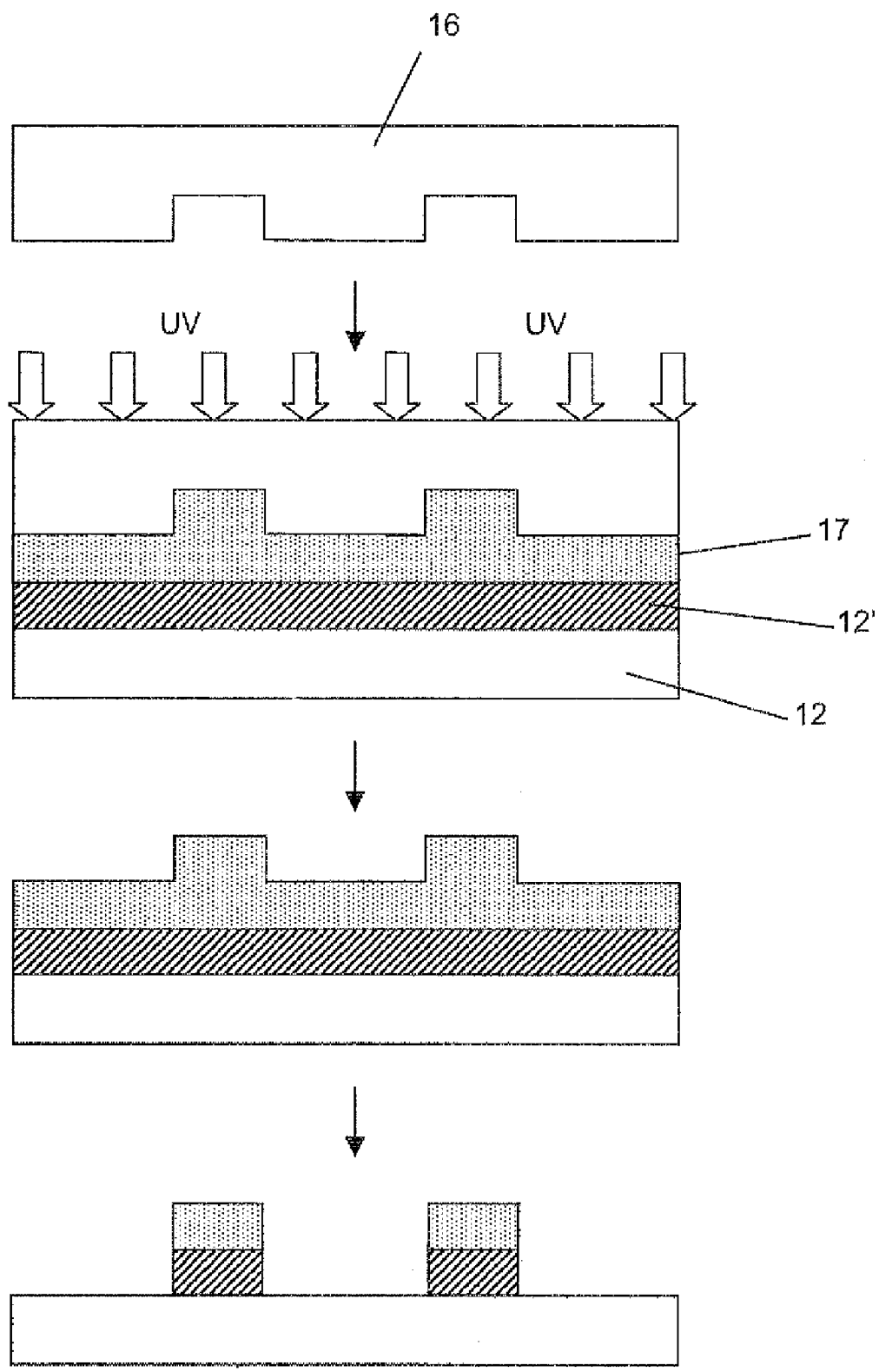

Examples of three approaches to imprint lithography are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto a resist layer 13 as an imprintable medium, which layer is supported by a substrate 12 and planarization and transfer layer 12'. The template 10 has a pattern of features on its surface, the molecular layer being disposed upon the features. When the template is pressed against the layer 13, the layer of molecules 11 are transferred onto the layer 13. After removal of the template, the layer 13 is etched such that the areas of the layer 13 not covered by the transferred molecular layer 11 are etched down to the substrate. For more information on micro-contact printing, see e.g. U.S. Pat. No. 6,180,239.

FIG. 1b shows an example of so-called hot imprint lithography (or hot embossing). In a typical hot imprint process, a template 14 is imprinted into a thermosetting or a thermoplastic imprintable medium 15 which has been cast on the surface of a substrate 12. The imprintable medium 15 may be, for example, resin. The resin may be, for instance, spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1c shows an example of UV imprint lithography, which involves the use of a transparent template and a UV-curable liquid as imprintable medium (the term "UV" is used here for convenience but should be interpreted as including any suitable actinic radiation for curing the imprintable medium). A UV curable liquid is often less viscous than the thermosetting and thermoplastic resins used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is "frozen" by curing the imprintable medium with UV radiation that is applied through the quartz template onto the imprintable medium. After removal of the template, the pattern will consist of the features in relief from a residual layer of the resin which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2A:
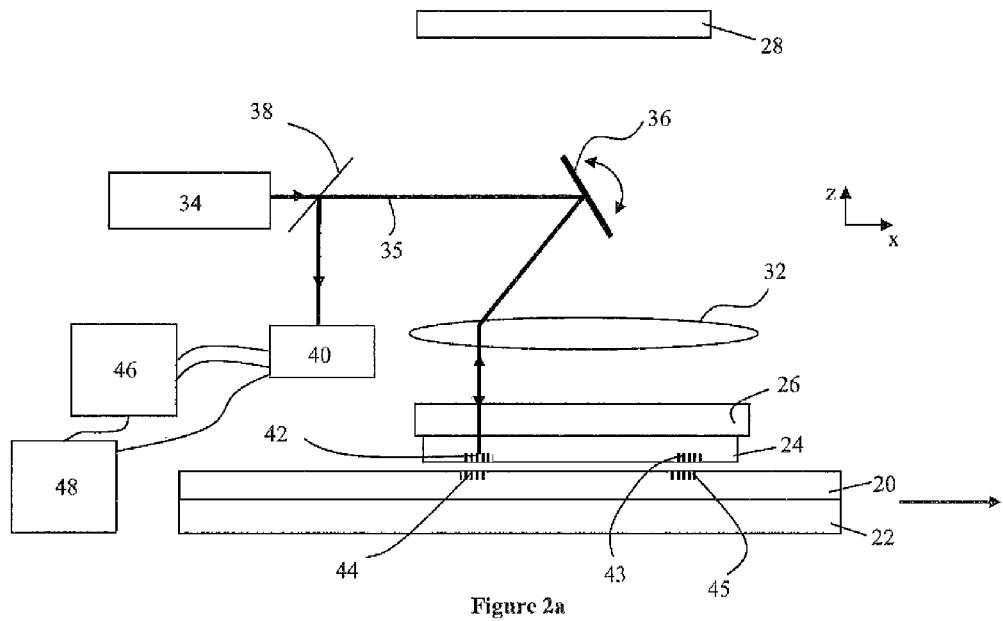
FIG. 2 schematically shows a lithographic apparatus according to an embodiment of the invention.

FIG. 2 shows schematically an imprint lithography apparatus according to an embodiment of the invention. Referring to FIG. 2a, a substrate 20 bearing a layer of imprintable medium (not shown) is provided on a substrate table 22. An imprint template 24 is held by an imprint template holder 26. A source of actinic radiation 28 (for example a UV radiation source) is provided above the imprint template holder 26. A lens 32 is provided between an actinic radiation source 28 and the imprint template holder 26.

The lithographic apparatus further comprises a source 34 which emits radiation (e.g. non-actinic radiation). The source 34 is configured to emit radiation at multiple wavelengths which may, for example, include visible radiation and infrared radiation. The source 34 will hereafter be referred to as the alignment beam source 34. The alignment beam source 34 provides a collimated beam of radiation which will hereafter be referred to as the alignment radiation beam 35.

A tip-tilt mirror 36 is provided above the imprint template holder 26. The tip-tilt mirror 36 can be tilted around the Y and Z axes, and is arranged to be moved between a plurality of orientations. Different orientations of the tip-tilt mirror 36 may direct the alignment radiation beam towards different alignment gratings 42, 43 provided on the imprint template 24. It is not essential that the tip-tilt mirror be arranged to tilt around the Y and Z axes; any suitable axes may be used. Any other suitable beam directing apparatus may be used instead of the tip-tilt mirror, such as a combination of moveable mirrors.

The lithographic apparatus further comprises a beam-splitter 38 and detector 40. The beam-splitter 38 is arranged to direct towards the detector 40 a portion of the alignment radiation beam 35 which has been diffracted from the substrate 20 or from the imprint template 24, as is explained below. The detector 40 is capable of distinguishing between different wavelengths of the alignment radiation beam 35 (the detector may be, for example, a spectroscopic detector that contains a wavelength-dispersive element such as a grating or a prism and a detector array). The detector 40 is therefore able to detect and provide output signals for a plurality of wavelengths. The detector 40 may, for example, be able to detect and provide an output signal for visible radiation which is present in the alignment radiation beam 35, and be able to detect and provide an output signal for infrared radiation which is present in the alignment radiation beam. The detector 40 may, for example, be able to detect and provide separate output signals for one or more different visible radiation wavelengths, one or more different infrared radiation wavelengths, or one or more different ultraviolet wavelengths (or any combination thereof).

The detector 40 provides multiple output signals based on the detected wavelengths, and passes these output signals to a processor 46. The processor 46 uses the signals to align the substrate 20 with respect to the imprint template 24 (and/or to align the imprint template with respect to the substrate). A controller 48 is connected to the processor. The controller 48 controls the position of the substrate table 22 (and/or the imprint template holder 26) in the X, Y and Z directions. The substrate table 22 may be moved, for example, by motors (not shown) of a type known to those skilled in the art. The position of the substrate table 22 may be monitored, for example, by one or more interferometers (not shown) of a type known to those skilled in the art.

During alignment, the actinic radiation source 28 is switched off (or the actinic radiation is blocked) such that actinic radiation is not directed onto the imprint template 24. A substrate 20 which has been provided with a layer of imprintable medium (not shown) is then placed on the substrate table 22. The substrate table is moved until a target portion (e.g. a die) of the substrate 20 is positioned beneath the imprint template 24, and the imprint template alignment marks 42, 43 are located over alignment gratings 44, 45 provided on the substrate.

Alignment of the target portion of the substrate 20 with the imprint template 24 is achieved in the following manner. The tip-tilt mirror 36 is oriented such that it directs the alignment radiation beam 35 towards a first imprint template alignment grating 42. A proportion of the alignment radiation beam 35 will be diffracted from the imprint template alignment grating 42, and a proportion of the alignment radiation beam will pass onto the substrate alignment grating 44. A proportion of the alignment radiation beam 35 will then be diffracted by the substrate alignment grating 44. The diffracted alignment radiation (i.e. alignment radiation which has been diffracted from the imprint template alignment grating 42 or the substrate alignment grating 44) passes back to the tip-tilt mirror 36. The tip-tilt mirror directs the diffracted alignment radiation towards the beam-splitter 38, which in turn directs the diffracted alignment radiation towards the detector 40. The detector provides output signals which pass to the processor 46.

The substrate table 22 (and substrate 20) moves, for example, in the X-direction while the alignment measurement is being made. This may be considered to be an example of a lateral movement (lateral movement may be considered to mean movement in a plane which is parallel or substantially parallel to the surface of the substrate). The movement may be a scanning motion over a length that is normally (but not necessarily) one or more pitches of the substrate alignment grating 44. As a result of this movement, the substrate alignment grating 44 moves beneath the imprint template alignment grating 42, thereby giving rise to a modulation of the diffracted alignment radiation. This modulation is measured by the detector 40. The detector measures the modulation at a plurality of wavelengths, and provides the plurality of output signals accordingly. For the purpose of the following explanation, two wavelengths will be referred to: the visible wavelength and the infrared wavelength. However, in general more than two wavelengths may be measured and used in calculations and need not be visible and infrared (e.g., they may all be infrared). The output signals are passed to the processor 46, which uses the signals to determine the position of the substrate alignment grating 44 relative to the imprint template alignment grating 42.

Figure 2B:
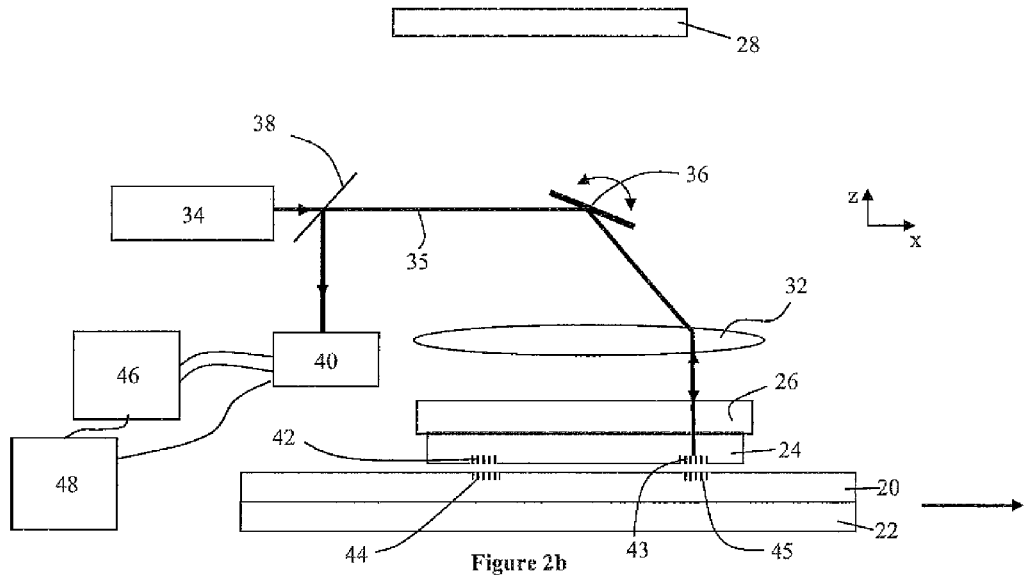

Referring to FIG. 2b, the tip-tilt mirror 36 is then moved to a new orientation, such that the alignment radiation beam 35 is directed towards a second imprint template alignment grating 43 and associated substrate alignment grating 45. Again, a portion of the alignment radiation beam 35 is diffracted, and passes via the tip-tilt mirror 36 and beam-splitter 38 to the detector 40. The substrate table 22 (and substrate 20) move with a scanning motion in the X-direction, thereby giving rise to a modulation of the diffracted alignment radiation. The detector 40 provides output signals which pass to the processor 46. The processor 46 uses the signals to determine the position of the second substrate alignment grating 45 relative to the second imprint template alignment grating 43.

The tip-tilt mirror 36 may then be moved to other orientations in order to direct the alignment radiation beam 35 towards other alignment gratings (not shown).

The processor 46 uses the signals output from the detector 40 to determine the aligned position of the substrate 20 relative to the imprint template 24. The aligned position may be, for example, the position in which a pattern provided on the imprint template 24 is aligned with a pattern provided on the substrate 20 (e.g. a previously formed layer of a die). Once the aligned position has been determined, the substrate 20 is moved to the aligned position. This may be achieved by moving the substrate table 22 using motors, while monitoring the position of the substrate table using an interferometer.

Once the substrate has been moved to the aligned position, the imprint template holder 26 is lowered (and/or the substrate table is raised) so that the imprintable medium flows into pattern recesses of the imprint template 24.

Figure 2C:
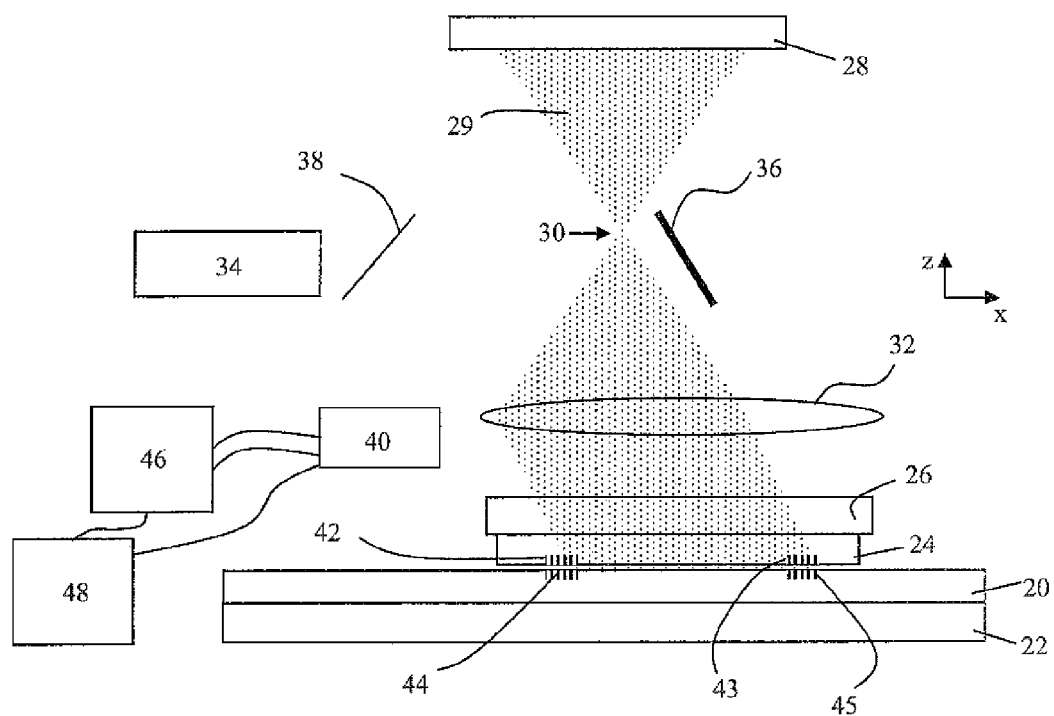

As shown in FIG. 2c, the radiation source 28 provides a beam of actinic radiation 29 which is directed onto the imprintable medium. The beam of actinic radiation 29 passes through a focal area or focal point 30 (focal area if the actinic radiation source 28 is an extended source; focal point if the actinic radiation source 28 is a point source). The lens 32, which is located some distance beyond the focal point 30, is arranged to collimate the actinic radiation beam 29, and to direct it through the imprint template holder 26 and imprint template 24 onto the imprintable medium.

The actinic radiation beam 29 passes through the focal point or focal area 30 in order to allow the tip-tilt mirror 36 to be provided above the imprint template holder 26, without the actinic radiation beam 29 hitting the tip-tilt mirror. Other arrangements of the actinic radiation and the tip-tilt mirror 36 may be used. For example, the tip-tilt mirror may be provided in some other location, and/or a beam-directing apparatus other than a tip-tilt mirror may be used to direct the alignment radiation beam 35 towards the imprint template. For example, a lens system, mirror array or other optical device may be used. The actinic radiation source may be provided in a different location, with the actinic radiation beam being directed to the imprint template, for example, by beam steering mirrors.

The actinic radiation beam 29 cures the imprintable medium, and thereby causes it to solidify. Once curing has taken place, the imprint template 24 and substrate 20 are separated. The substrate table 22 (and/or imprint template holder 26) is then moved in the X or Y direction until a different target portion (e.g. a different die) of the substrate 20 is located beneath the imprint template 24. The alignment and imprinting process is then repeated.

FIG. 2c shows the imprint template alignment gratings 42, 43 as being fully aligned with the substrate alignment gratings 44, 45. It may be that when the substrate 20 is in the aligned position, the alignment gratings are fully aligned in this way. However, this is not essential. There may be, for example, some form of offset included in the positions of the alignment gratings, which is taken into account when determining the aligned position of the substrate.

The alignment gratings 42-45 are diffraction gratings. They may, for example, have a pitch of 400 nm. Referring to FIG. 2a, during the alignment process, adjacent alignment gratings 42, 44 may be separated by, for example, 2 microns or less. This is sufficiently close that the adjacent alignment gratings couple with each other to form a composite diffraction grating. Another way of expressing this is to say that a diffraction order from one alignment grating 42 acts as a new illumination beam for the other alignment grating 44, which results in an interplay of propagating diffraction orders between the alignment gratings.

An upper limit for the separation of the substrate alignment grating 44 and the imprint template alignment grating 42 may arise from the bandwidth of the alignment radiation beam, and/or from the spectral resolution of the detector 40. Coupling arises from interference between alignment radiation returning towards the detector 40 from the imprint template alignment grating 42 and alignment radiation returning towards the detector 40 from the substrate alignment grating 44. In order for this interference to occur, the coherence length of alignment radiation beam 35 should be longer than the difference between the optical path traveled by radiation returned from the imprint template alignment grating 42 and the optical path traveled by radiation returned from the substrate alignment grating 44. The coherence length of the alignment radiation beam 35 may be more than twice the optical path difference, and may be more than ten times the optical path difference. Making the coherence length longer (with respect to the optical path difference) will tend to increase the strength of the interference.

A measurement bandwidth of about 10 nm may, for example be used, which would give rise to a coherence length of about 20-30 microns. A separation of about 2 microns would give rise to strong interference between radiation diffracted by the substrate alignment grating 44 and radiation diffracted by the imprint template alignment grating 42. Narrowing the measurement bandwidth (and thereby increasing the spectral resolution of the detector 40), would allow the separation to be increased while retaining interference between the gratings.

As a result of the coupling of the adjacent alignment gratings 42, 44 to form a composite diffraction grating, the intensity of the 0th diffraction order (specular reflection) becomes a periodic function of the relative X-positions of the adjacent alignment gratings 42, 44. Since the substrate 20 moves in a scanning motion in the X-direction during alignment, this periodic function gives rise to modulation of the intensity of the diffracted alignment radiation. This intensity-modulated diffracted alignment radiation passes via the tip-tilt mirror 36 and the beam splitter 38 to the detector 40. The detector separately detects the modulation of the visible wavelength alignment radiation and the modulation of the infrared wavelength alignment radiation.

The above explanation of the operation of the composite grating mentions that the diffracted intensity varies as a function of the relative X-positions of the alignment targets. However, the diffracted intensity also varies as a periodic function of the relative Z-positions of the alignment targets (i.e. as a function of their separation). Since a substrate is often not completely flat, the separation in the Z-direction of the alignment targets could vary during an alignment measurement. This could give rise to errors in the measured aligned position. However, the embodiment of the invention avoids this potential error by measuring different wavelengths of the alignment radiation beam 35, as is explained below.

The periodic signal which is measured by the detector varies as a function of the relative X-positions and Z-positions of the gratings 42, 44 for shorter wavelengths of the alignment radiation beam 35. However, it varies only as a function of the relative Z-positions of the gratings for longer wavelengths, and does not vary as a function of the relative X-positions. This is due to the fact that at sufficiently long wavelengths there are no higher diffraction orders propagating between the gratings 42, 44 (only the $0^{th}$ order propagates between the gratings). The phase of the $0^{th}$ order does not contain lateral position information and is only sensitive to changes in the Z-direction.

Although many wavelengths may be used, for the purpose of the following explanation the detected alignment beam will be considered to comprise a single longer wavelength ($\lambda_1$) (e.g. an infrared wavelength) and a single shorter wavelength ($\lambda_2$) (e.g. a visible wavelength).

The signal which arises from the detected longer wavelength ($\lambda_1$) is generally of the form:

$$I_{\lambda_1}(Z) = A_0 + A_1 \cos\left(4\pi \frac{Z}{\lambda_1}\right) + \ldots + A_n \cos\left(4n\pi \frac{Z}{\lambda_1}\right) \quad \text{Eqn (1)}$$

where $I_{\lambda_1}$ is the intensity of the signal, Z is the separation between the adjacent gratings 42, 44, and $A_n$ is a constant which is different for each harmonic of the signal. The value of $A_n$ is determined by the composition of layers between and below the gratings, and the shape and thickness of lines of the gratings. The size of the $A_n$ constant is sufficiently small for orders higher than the $2^{nd}$ harmonic that it does not have a significant effect on the signal. Thus, in most practical cases the signal Z is close to sinusoidal, with relatively small higher harmonic terms.

The signal which arises from the detected shorter wavelength ($\lambda_2$) is generally of the form:

$$I_{\lambda_2}(X,Z) = \left[B_0 + B_1 \cos\left(4\pi \frac{Z}{\lambda_2}\right) + \ldots + B_n \cos\left(4n\pi \frac{Z}{\lambda_2}\right)\right] \times \quad \text{Eqn (2)}$$
$$\left[C_0 + C_1 \cos\left(2\pi \frac{X}{\lambda_2}\right) + \ldots + C_n \cos\left(2n\pi \frac{X}{\lambda_2}\right)\right]$$

where $I_{\lambda_2}$ is the intensity of the signal, Z is the separation between the adjacent gratings 42, 44, $B_n$ is a constant which is different for each harmonic of the signal, X is the relative positions of the adjacent gratings in the X-direction, and $C_n$ are constants with a value that is again determined by the composition of layers between and below the gratings, and the shape and thickness of lines of the gratings.

Since the signal measured at the longer wavelength ($\lambda_1$) varies only as a function of the relative Z-positions (i.e. the separation between the gratings) of the gratings for the longer wavelength, and does not vary as a function of the relative X-positions, it can be used to monitor the relative Z-positions of the gratings 42, 44.

The processor 46 monitors the signal measured at the longer wavelength ($\lambda_1$), and the controller 48 uses this to control the Z-position of the substrate table 20. The signal measured at the longer wavelength (or a signal measured by a separate measurement apparatus) may be used to position the substrate table 20 such that the substrate alignment grating 44 is located at a desired separation in the Z-direction from the imprint template alignment grating 42. The separation may be calculated from the signal measured at the longer wavelength using known critical dimension metrology scatterometry techniques.

During an alignment scan (i.e. scanning movement of the substrate table 20 in the X-direction), the signal measured at the longer wavelength may be used to ensure that the separation between the substrate alignment grating 44 and the imprint template alignment grating 42 remains constant (or substantially constant). Since the surface of the substrate 20 may be uneven, adjustment of the Z-position of the substrate table 22 during the alignment scan may be needed in order to achieve this. Adjustment of the Z-position of the substrate table 22 may be continuously performed such that the signal measured at the longer wavelength remains constant (or substantially constant), thereby ensuring that the separation between the substrate alignment grating 44 and the imprint template grating 42 remains constant (or substantially constant).

The adjustment of the Z-position of the substrate table 22 may be controlled by the controller 48. The controller may receive the longer wavelength signal directly from the detector 40 (without processing of the signal by the processor 46), and may control the Z-position based on this signal. Alternatively, the signal may be processed by the processor 46 before being passed to the controller 48.

The adjustment of the Z-position may be performed using a motor in a manner which will be known to those skilled in the art. The Z-position of the imprint template holder 26 may be adjusted instead of (or as well as) the Z-position of the substrate table 22. During the alignment scan, it is not necessary to know the absolute value of the Z-direction separation of the substrate alignment grating 44 and the imprint template alignment grating 42 (the separation may merely remain constant or substantially constant).

Since the Z-direction separation of the substrate alignment grating 44 and the imprint template alignment grating 42 is held constant (or substantially so) during an alignment scan, the signal measured at the shorter wavelength is a function only of the relative X-positions of the alignment gratings. The signal measured at the shorter wavelength will be a time varying signal that may be sinusoidal or close to sinusoidal (arising from the scanning movement of the substrate 20 relative to the imprint template 24). The measured signal can be used by the processor 46 to determine the position of the substrate alignment grating 44 relative to the imprint template alignment grating 42. This can, for example, be done by fitting a set of sinusoidal and cosinusoidal functions to the measured signal in a manner that is known to a person skilled in the art. The substrate 20 may then be moved in the X-direction such that it is in the aligned position (in the X-direction) with respect to the imprint template 24.

In an alternative method, instead of maintaining a constant separation between the imprint template alignment grating 42 and the substrate alignment grating 44 during the alignment scan, the separation is allowed to vary (e.g. as a result of non-flatness of the surface of the substrate 22). The effect of the varying separation, as measured by the longer radiation, is then taken into account during the calculation of the position of the substrate alignment grating 44 relative to the imprint template alignment grating 42. This calculation entails determining a numerical solution for Equations 1 and 2, and may be performed using known critical dimension metrology scatterometry techniques.

The alignment gratings of the illustrated embodiment extend in the X-direction, and therefore allow alignment of the substrate 20 relative to the imprint template 24 in the X-direction. Alignment gratings extending in the Y-direction may also or instead be provided, in order to allow alignment of the substrate 20 relative to the imprint template 24 in the Y-direction.

The X-positions and Y-positions referred to above may be considered to be examples of lateral positions (the term lateral position may be considered to mean a position in a plane which is parallel or substantially parallel to the plane of the substrate). Scanning motion in the X-direction and scanning motion in the Y-direction may be considered to be examples of lateral scanning motion.

The alignment radiation beam 35 may be, for example, formed using a radiation source 34 that emits a continuous spectrum over a range of wavelengths. For example, the radiation source may be a Quartz Tungsten Halogen (QTH) source, a Xenon discharge source or a so-called super-continuum source.

The alignment radiation beam 35 may be a laser beam provided by a laser 34. The laser may be configured to provide alignment radiation at a plurality of wavelengths, which may include one or more visible wavelengths and one or more infrared wavelengths. The laser may be configured to provide alignment radiation at two wavelengths, one of which may be a visible wavelength and one of which may be an infrared wavelength. The laser may provide, for example, alignment radiation at an infrared wavelength, and may pass through a nonlinear optical apparatus which doubles the frequency of a part of the laser beam. This may provide co-propagating visible and infrared laser beams.

It has been mentioned above that the detector 40 may be a spectroscopic detector that contains a wavelength-dispersive element such as a grating or a prism and a detector array. However, the detector may take any suitable form. Examples of detectors which may be used are shown schematically in FIG. 3.

Figure 3A:
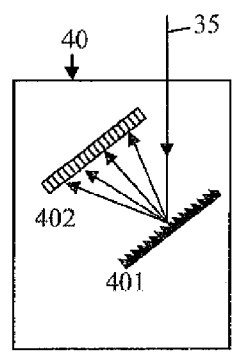
FIG. 3 schematically shows detectors which may form part of the lithographic apparatus.

FIG. 3a shows a detector 40 which comprises a wavelength dispersive grating 401 and a detector array 402. The wavelength dispersive grating 401 disperses different wavelengths of the alignment radiation beam 35 into a fan, such that different wavelengths are incident at different locations on the detector array 402. Different parts of the array 402 are therefore able to detect different wavelengths of the alignment radiation beam. The wavelength dispersive grating 401 may be, for example, a spectroscopy grating.

Figure 3B:
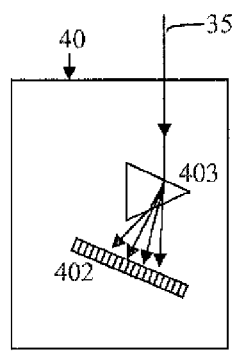

FIG. 3b shows a detector 40 which comprises a prism 403 and a detector array 402. The prism 403 provides the same function as the grating 401, i.e. the prism disperses different wavelengths of the alignment radiation beam 35 into a fan, such that different wavelengths are incident at different locations on the detector array 402. Different parts of the array 402 are therefore able to detect different wavelengths of the alignment radiation beam. The prism may be referred to as a dispersion prism.

The detector array 402 in FIG. 3a or FIG. 3b may be, for example, a CCD or CMOS array.

Figure 3C:
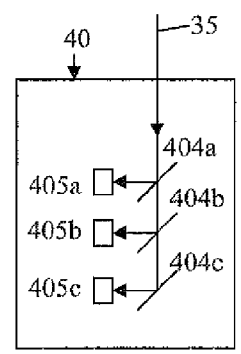

FIG. 3c shows a detector 40 which comprises a series of wavelength selective beamsplitters 404a-c and a series of associated detectors 405a-c. Each wavelength selective beamsplitter 404a reflects a different wavelength or range of wavelengths, while allowing other wavelengths to pass through without reflection. In one example, the first beamsplitter 404a reflects a wavelength $\lambda_1$ (or a range of wavelengths centered on this wavelength), the second beamsplitter 404b reflects a wavelength $\lambda_2$ (or a range of wavelengths centered on this wavelength), and the third beamsplitter 404c reflects a wavelength $\lambda_3$ (or a range of wavelengths centered on this wavelength). Each detector 405a-c is thereby able to detect a different wavelength (or range of wavelengths).

The detectors 405a-c may be, for example, photo detectors such as PIN photodiodes or avalanche photodiode (APD) detectors. These detectors may have a larger dynamic range than CCD or CMOS arrays. Although only three dichroic beamsplitters 404a-c and three associated detectors 405a-c are shown, any number may be used.

In some instances, wavelengths of the alignment radiation beam 35 which fall outside of a range of wavelengths used by the detector 40 to provide output signals may be filtered out of the alignment radiation beam, prior to the alignment radiation beam being incident upon the detector. This filtering may be performed by one or more filters provided at any suitable location. A filter may be, for example, positioned such that it filters out actinic UV radiation from the alignment radiation beam 35, prior to the alignment radiation beam being incident upon the substrate 20.

Although the above description refers to the use of infrared radiation and visible radiation, it is not essential that radiation in this combination of wavelengths is used. In general, radiation which has a wavelength sufficiently long, relative to the pitch of the alignment gratings, is used such that diffraction of that wavelength by the alignment gratings is not significantly affected by their lateral positions relative to one another. The general term 'longer wavelength' is used for this wavelength. Diffraction of the longer wavelength without being affected by lateral alignment grating positions may occur if only zero diffraction orders propagate between the alignment gratings, and significant amounts of the $1^{st}$ diffraction order and higher diffraction orders do not propagate between the alignment gratings. This may be achieved for example by selecting the longer wavelength to be 2 or more times longer than the pitch of the alignment gratings (assuming that the alignment radiation beam is incident on the alignment gratings at a normal or close to normal angle of incidence). Selection of the wavelength may need to take into account the refractive index of material surrounding the alignment gratings.

In addition, radiation which has a wavelength sufficiently short, relative to the pitch of the alignment gratings, is used such that diffraction of that wavelength by the alignment gratings is strongly affected by their lateral positions relative to one another. The general term 'shorter wavelength' is used for this wavelength. The shorter wavelength is such that significant amounts of radiation in the $1^{st}$ diffraction order propagate between the alignment gratings. This may be achieved, for example, by selecting the shorter wavelength such that it is not greater than the pitch of the alignment gratings multiplied by the refractive index of the medium between the alignment grating (e.g., imprintable medium located between the alignment gratings). Taking as an example an alignment grating pitch of 400 nm and a refractive index of 1.6, the shorter wavelength should not be greater than 640 nm (assuming that the alignment radiation beam is incident on the alignment gratings at a normal or close to normal angle of incidence).

If the alignment radiation beam is incident on the alignment gratings at an angle of incidence which is not normal or close to normal, then simple geometry may be used to take into account the angle of incidence when selecting appropriate longer and shorter wavelengths.

The shorter wavelength radiation should not be actinic with respect to the imprintable medium. In other words, the shorter wavelength should be sufficiently long that it does not cause curing of the imprintable medium. It is possible for the shorter wavelength to be ultraviolet for example, provided that it does not cause curing of the imprintable medium.

In one example, the pitch of the alignment gratings is 400 nm. The longer wavelength radiation is 950 nm: (infrared), and the shorter wavelength radiation is 500 nm (visible).

The alignment gratings are sufficiently large that the alignment radiation beam does not extend beyond edges of the gratings during alignment. This avoids loss of signal during alignment. The alignment gratings may, for example, measure 38×38 microns. The alignment gratings may be any other suitable size. The alignment radiation beam may, for example, have a cross sectional area (referred to hereafter as the measurement spot width) at the alignment gratings of 20-30 microns.

The pitch of the alignment gratings may be sufficiently small, relative to the measurement spot width of the alignment radiation beam, that at least 20 grating lines fall within the width of the measurement spot.

The substrate alignment grating 44 may be partially reflective. The imprint template alignment grating 42 may be partially reflective.

As mentioned further above, when alignment is to take place, the substrate table is moved until a target portion (e.g. a die) of the substrate 20 is positioned beneath the imprint template 24, and the imprint template alignment gratings 42, 43 are located over the alignment gratings 44, 45 provided on the substrate. The accuracy with which the substrate table is positioned in this initial alignment phase (sometimes referred to as coarse alignment) is such that the imprint template alignment gratings 42, 43 and substrate alignment gratings 44, 45 are aligned sufficiently close to allow alignment (sometimes referred to as fine-alignment) to be performed.

The initial alignment (coarse alignment) of the substrate with respect to the imprint template should be within the capture range provided by the alignment gratings 42, 44. The term 'capture range' is intended to mean the range of misalignments of the substrate 20 from the aligned position over which alignment can be achieved using the alignment gratings. The capture range of an embodiment may be less than the pitch of the alignment gratings. The capture range may be approximately a quarter of the pitch of the alignment gratings.

The link between the capture range and the alignment grating pitch may influence the alignment grating pitch which is used. A smaller alignment grating pitch will require a higher accuracy of coarse alignment, in order to ensure that the coarse alignment aligns the alignment gratings within the capture range.

Figure 4:
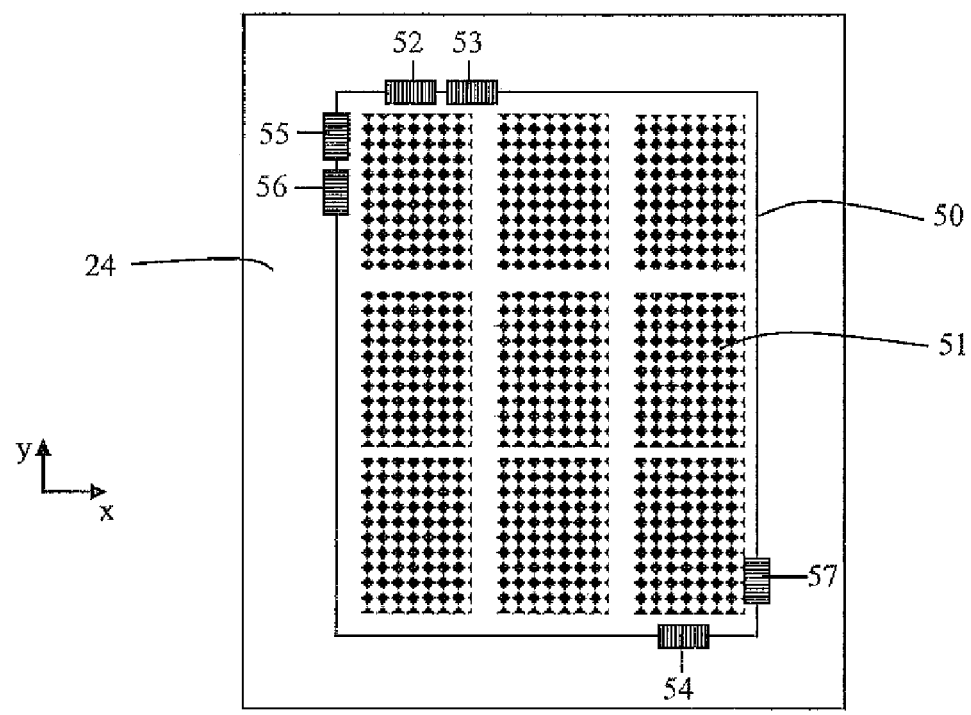
FIG. 4 schematically shows an imprint template according to an embodiment of the invention.

Capture range may be extended using the Moiré effect. An example of an alignment grating arrangement which may achieve this is shown in FIG. 4. The imprint template 24 is provided with a patterned area 50. The patterned area 50 comprises nine dies 51 and several alignment gratings. Three of the alignment gratings extend in the X-direction, and three extend in the Y-direction. The X-direction alignment gratings 52-54 may be considered to correspond to those shown in FIG. 2. The Y-direction alignment gratings 55-57 are equivalent to the X-direction alignment gratings 52-54, and will not be described in detail. The alignment gratings 52-57 are provided in areas which will form scribe lanes on the substrate.

In this example, a first of the X-direction alignment gratings 52 has a pitch of 400 nm, and a second of the X-direction alignment gratings 53 has a pitch of 420 nm. The first and second X-direction alignment gratings 52, 53 are placed adjacent to one another. As a result of the difference of pitch between the first and second X-direction alignment gratings 52, 53, a Moiré pattern is seen when an alignment radiation beam having an appropriate wavelength is directed at the alignment gratings. This Moiré pattern has a period which is significantly longer than the pitch of the alignment gratings, and therefore allows capture over a wider range of positions in the X-direction than would otherwise be possible. In the described embodiment, the alignment radiation beam 35 does not illuminate two alignment gratings simultaneously, and the Moiré pattern will therefore not arise directly in the diffracted radiation. However, the Moiré pattern may be seen via analysis of the diffracted radiation detected separately for the different alignment gratings. In order for the Moiré pattern to be seen, the accuracy with which the substrate table 22 may be positioned in the X-direction may need to be of the order of nanometers.

A third of the X-direction alignment gratings 54 is located at an opposite corner of the patterned area 50 from the first and second X-direction alignment gratings 52, 53. This alignment grating is not paired with an additional X-direction alignment grating, since there is no need to obtain a second Moiré pattern for capture purposes. The third x-direction alignment grating may, for example, have a pitch of 440 nm or 460 nm. The third X-direction alignment grating allows the alignment measurement to be used to determine whether a substrate to be imprinted (or a pattern on the substrate) has been rotated relative to the imprint template 24.

The Y-direction alignment gratings 55-57 operate in the same manner as the X-direction alignment gratings 52-54 (lateral movement of the substrate 20 relative to the imprint template 24 is in the Y-direction instead of the X-direction).

Alignment gratings having the same pitches and the same dimensions (or similar dimensions) are provided on a substrate which is to be aligned with the imprint template 24. Alignment of the substrate to the imprint template may be performed per imprint. Where this is the case, a plurality of sets of alignment gratings may be provided on the substrate, each set allowing alignment of the imprint template with a different location on the substrate, such that the pattern may be imprinted at that location on the substrate.

Any number of alignment gratings may be provided on the imprint template (together with corresponding alignment gratings on a substrate to be aligned). Although it may be possible to obtain alignment using a single X-direction alignment grating and a single Y-direction alignment grating, this may for example fail to measure rotation of the substrate (or pattern on the substrate). For this reason two X-direction alignment gratings and two Y-direction alignment gratings, located at different positions on the patterned area, may be used. More than two alignment gratings may be used in each direction. This may be, for example, to provide an increased capture range, as explained above. Alternatively, it may be to provide some redundancy in the alignment gratings, such that alignment may still be performed even if one or more of the substrate alignment gratings has been damaged. For example, 24 alignment gratings may be provided on the substrate, with signals from 8 or 10 of the alignment gratings being used for alignment.

The imprint template may be an imprint template which is sufficiently large to pattern an entire substrate in one go. Alternatively, multiple imprints of the imprint template onto the substrate may be required in order to pattern the substrate.

In the described embodiments, alignment is achieved by moving the substrate table 20 in the X and Y directions. However, it is possible to move the imprint template 24 in the X and Y directions to achieve alignment. This may be done instead of, or as well as, movement of the substrate table 20 in the X and Y directions. In general terms, it may be said that there is relative movement between the substrate and the imprint template.

Although described embodiments use UV imprint lithography, an embodiment of the invention may use other forms of imprint lithography such as hot imprint lithography.

An embodiment of the invention may be used, for example, when imprinting integrated circuit patterns onto substrates, or other patterns onto substrates.

The invention claimed is:

1. A method of determining the location of a lithographic substrate relative to an imprint template, the method comprising:
    positioning the substrate adjacent to the imprint template such that an alignment grating on the substrate and an alignment grating on the imprint template form a composite diffraction grating;
    directing an alignment radiation beam comprising radiation at a first wavelength and radiation at a second wavelength, the second wavelength being longer than the first wavelength, at the composite diffraction grating;
    providing relative lateral movement between the imprint template and the substrate;
    detecting radiation diffracted from the composite grating during the relative lateral movement;
    using the detected radiation at the second wavelength to obtain information regarding a separation between the substrate alignment grating and the imprint template alignment grating; and
    using the detected radiation at the first wavelength to obtain information regarding the lateral position of the substrate alignment grating relative to the imprint template alignment grating.

2. The method of claim 1, wherein the first wavelength is sufficiently short, relative to the pitch of the imprint template alignment grating and the substrate alignment grating, that significant amounts of radiation in the $1^{st}$ diffraction order propagate between the alignment gratings.

3. The method of claim 2, wherein the first wavelength is one of a plurality of wavelengths which are each sufficiently short, relative to the pitch of the imprint template alignment grating and the substrate alignment grating, that significant amounts of radiation in the $1^{st}$ diffraction order propagate between the alignment gratings, and wherein the detector is arranged to detect the plurality of wavelengths.

4. The method of claim 1, wherein the second wavelength is sufficiently long, relative to the pitch of the imprint template alignment grating and the substrate alignment grating, that significant amounts of radiation in the $1^{st}$ diffraction order do not propagate between the alignment gratings.

5. The method of claim 4, wherein the second wavelength is one of a plurality of wavelengths which are each sufficiently long, relative to the pitch of the imprint template alignment grating and the substrate alignment grating, that significant amounts of radiation in the $1^{st}$ diffraction order do not propagate between the alignment gratings, and wherein the detector is arranged to detect the plurality of wavelengths.

6. The method of claim 1, wherein the pitch of the substrate alignment grating is the same as the pitch of the imprint template alignment grating.

7. The method of claim 1, wherein the relative lateral movement between the imprint template and the substrate is achieved by moving the substrate in a lateral direction.

8. The method of claim 1, wherein the alignment radiation beam has a coherence length which is longer than difference between the optical path traveled by radiation returned from the imprint template alignment grating and the optical path traveled by radiation returned from the substrate alignment grating.

9. The method of claim 1, wherein the information regarding the separation between the substrate alignment grating and the imprint template alignment grating is used to maintain a substantially constant separation between the substrate alignment grating and the imprint template alignment grating during the relative lateral movement between the imprint template and the substrate.

10. The method of claim 1, wherein variation of the separation between the substrate and the imprint template during the relative lateral movement between the imprint template and the substrate is measured, and the variation is taken into account when determining the lateral location of the substrate alignment grating relative to the imprint template alignment grating.

11. The method of claim 1, wherein the alignment radiation beam is directed towards an other composite grating and the method is repeated for that composite grating.

12. The method of claim 1, wherein the imprint template alignment grating is larger than the width of the alignment radiation beam.

13. The method of claim 1, wherein the first wavelength is a visible wavelength, and the second wavelength is an infrared wavelength.

14. The method of claim 1, used to determine the aligned position of the substrate with respect to the imprint template.

15. A lithographic apparatus comprising:
an imprint template holder configured to hold an imprint template;
a substrate table configured to hold a substrate to be imprinted by the imprint template;
an alignment radiation beam source configured to provide an alignment radiation beam comprising radiation which includes a first wavelength and a second wavelength;
a detector arranged to detect the intensity of alignment radiation diffracted from an alignment grating provided on the imprint template and an alignment grating provided on the substrate, the detector configured to distinguish between the first wavelength and the second wavelength; and
a controller configured to receive a signal relating to the detected intensity of the diffracted second wavelength, and to use the signal to maintain a constant or substantially constant separation between the imprint template alignment grating and the substrate alignment grating during lateral movement of the imprint template relative to the substrate.

16. The lithographic apparatus of claim 15, further comprising a processor configured to receive signals output by the detector, and to determine an aligned position for the substrate relative to the imprint template using the signals.

17. The lithographic apparatus of claim 15, further comprising a beam-directing apparatus arranged to direct the alignment radiation beam towards different locations on the imprint template.

18. The lithographic apparatus of claim 15, wherein the detector comprises a grating or prism and a detector array.

19. The lithographic apparatus of claim 15, wherein the detector comprises a series of wavelength selective beam-splitters and an associated series of detectors.

20. The lithographic apparatus of claim 15, further comprising an imprint template provided with a plurality of alignment gratings, and a substrate provided with a plurality of alignment gratings having corresponding pitches.

21. A lithographic apparatus comprising:
an imprint template holder configured to hold an imprint template;
a substrate table configured to hold a substrate to be imprinted by the imprint template;
an alignment radiation beam source configured to provide an alignment radiation beam comprising radiation which includes a first wavelength and a second wavelength;
a detector arranged to detect the intensity of alignment radiation diffracted from an alignment grating on the imprint template and an alignment grating on the substrate, the detector configured to distinguish between the first wavelength and the second wavelength; and
a processor configured to receive signals output by the detector, and to determine the lateral location of the substrate alignment grating relative to the imprint template alignment grating, the processor being configured to take into account variation of the separation between the substrate and the imprint template during relative lateral movement between the imprint template and the substrate.

* * * * *